United States Patent
Wada et al.

(10) Patent No.: US 6,852,626 B1
(45) Date of Patent: Feb. 8, 2005

(54) FILM DEPOSITION METHOD AND APPARATUS

(75) Inventors: Yuichi Wada, Narita (JP); Hiroyuki Yarita, Narita (JP); Hisashi Aida, Narita (JP); Naomi Yoshida, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/830,611

(22) PCT Filed: Oct. 29, 1999

(86) PCT No.: PCT/JP99/06032

§ 371 (c)(1),
(2), (4) Date: Apr. 30, 2001

(30) Foreign Application Priority Data

Oct. 29, 1998 (JP) .......................................... P10-308654

(51) Int. Cl.$^7$ ................................................ H01L 21/44
(52) U.S. Cl. ....................................... 438/681; 438/687
(58) Field of Search ................................. 438/681, 687

(56) References Cited

U.S. PATENT DOCUMENTS

| | | | | |
|---|---|---|---|---|
| 6,159,855 | A | * 12/2000 | Vaartstra | ..................... 438/681 |
| 6,368,945 | B1 | * 4/2002 | Im | .............................. 438/487 |
| 6,368,954 | B1 | * 4/2002 | Lopatin et al. | ............. 438/627 |
| 6,624,072 | B2 | * 9/2003 | Vaartstra | ..................... 438/681 |
| 6,645,860 | B2 | * 11/2003 | Charneski et al. | .......... 438/681 |

FOREIGN PATENT DOCUMENTS

| | | | |
|---|---|---|---|
| JP | 62-120475 | 6/1987 | |
| JP | 63-125681 | 5/1988 | ........... C23C/16/54 |
| JP | 4-53132 | 2/1992 | |
| JP | 04-080363 | 3/1992 | ........... C23C/16/06 |
| JP | 7-267621 | 10/1995 | |
| JP | 9-45773 | 2/1997 | |
| JP | 9-302471 | 11/1997 | |
| JP | 10-135154 | 5/1998 | ......... H01L/21/285 |
| JP | 10-140352 | 5/1998 | ........... C23C/16/18 |
| JP | 11-1778 | 1/1999 | |

* cited by examiner

*Primary Examiner*—Lynne A. Gurley
(74) *Attorney, Agent, or Firm*—Moser, Patterson & Sheridan, L.L.P.

(57) ABSTRACT

In the film deposition method of the present invention, an organometallic fluid, which has an organic metal such as a copper diketonate as its main component, and which precipitates film deposition material through a pyrolytic decomposed reaction, is first prepared; and the organometallic fluid is then applied onto a semiconductor wafer at a certain temperature within the non-reactive range of the organic metal. Afterwards, the wafer is heated to a predetermined temperature, the organic metal within the organometallic fluid that is applied onto the wafer is pyrolytically decomposed, and film is formed on the wafer. With this method, since application is performed at a temperature within the non-reactive range of the organic metal, deposition of the film does not occur, allowing uniform and homogenous application to be performed. Also, since pyrolytic decomposition is performed separately in a later process, a stable reaction may be assured, so that a film of uniform thickness and quality may be deposited.

9 Claims, 11 Drawing Sheets

FILM DEPOSITION METHOD AND APPARATUS

TECHNICAL FIELD

The present invention relates to fabrication processing techniques of semiconductor devices and related devices. In particular, it relates to techniques for performing film deposition using fluids that have an organic metal as the main component (organometallic fluids).

BACKGROUND ART

In recent years, as improvements in the integration and miniaturization of the semiconductor device progresses, there has been a steady shift from the present sub-half-micron range to the sub-quarter-micron range. In this quest to develop the next generation of semiconductor devices, film deposition techniques are exceedingly important.

In response to demands for improvements in integration and further miniaturization, switching from aluminum-based materials to copper-based materials being used as interconnective material is under consideration. Presently, metalorganic chemical vapor deposition (MOCVD), which is performed by vaporizing an organic metal, such as (hfac) $Cu^{+1}$(tmvs), which is usually fluid at room temperature and under normal pressure, introducing it to the process chamber, and depositing a film by causing a pyrolytic decomposition reaction to occur on the wafer being held in said process chamber, is put to use.

Such conventional MOCVD processes thus provide superb step coverage and are extremely effective in the fabrication of very thin films. However, with these MOCVD processes, at times when it is necessary to guarantee a sufficient layer thickness, for example during the step of filling in contact holes, problems such as the lack of efficiency develop. It takes time to fill in the hole completely since there is a limit to the thickness of the layer which can be accumulated during a certain length of time due to the low amounts of the organic metal itself existing in the process chamber, resulting from the low pressure in the process chamber. There is an additional danger of the vaporized organic metal reacting inside the supply pipeline and clogging the pipes.

The present invention takes the above information into consideration and aims to provide a film deposition process and apparatus, which use organometallic fluids, wherewith highly effective film deposition can be performed without causing blockage in the supply pipeline.

DISCLOSURE OF THE INVENTION

In order to fulfill the objective mentioned above, the inventors considered many variables. As a result, they found that the pyrolytic decomposition of organometallic fluid occurs by heating it even if it does not vaporize thus resulting in film formation. From this, the inventors considered methods of applying organometallic fluid while heating the wafer; however, with this method, since pyrolytic decomposition successively occurs as it is applied, they came to the conclusion that it is difficult to perform uniform film deposition throughout the wafer. The present invention was first formulated based on these findings.

Namely, the present invention is characterized by a film deposition process comprising a first step of preparing a fluid that has organic metal as a main component, which deposits a film deposition material using pyrolytic decomposition; a second step of applying the organometallic fluid onto a to-be-processed body at a temperature within the non-reactive domain of said organic metal; and afterwards, a third step of heating the to-be-processed body to a predetermined temperature, and causing pyrolytic decomposition of said organic metal throughout the organometallic fluid that is applied onto the to-be-processed body to form a film on the to-be-processed body.

With this method, since application is performed at a temperature within the non-reactive domain of said organic metal, a film deposition material is not deposited. Therefore, the application can be performed uniformly and homogenously. In addition, pyrolytic decomposition will be performed by itself after this so that a stable reaction may be guaranteed and a film with uniform thickness and quality may be formed.

It is noted here that the organometallic fluid may comprise solely an organic metal, or it may comprise a mixture of an organic metal and a solvent. It is also noted that in this specification, 'mixed fluids' may refer to cases where the organic metal is completely dissolved or it may refer to cases where part of it is suspended. Furthermore, 'application' may refer to cases where the to-be-processed body is immersed into the organometallic fluid, or it may refer to cases such as where the organometallic fluid is atomized and then applied.

As for the organic metal, any suitable copper diketonate such as (hfac)$Cu^{+1}$(tmvs) or (hfac)$Cu^{+1}$(teovs) may be used for copper film deposition, and any suitable aliphatic saturated hydrocarbon such as heptadecane, pentadecane, hexadecane, or octadecane may be used as the solvent thereof.

It is preferable that the film deposition apparatus used to execute the film deposition method above comprise a supply means, which supplies an organometallic fluid that has organic metal as a main component, for depositing a film deposition material using pyrolytic decomposition; an application means, which applies an organometallic fluid that is supplied from the supply means onto a to-be-processed body; and a heating means, which heats the to-be-processed body to a predetermined temperature; wherein said heating means heats the to-be-processed body after the application of organometallic fluid by the application means.

When separate process chambers are provided for the respective application means and heating means, an appropriate carrying means may be used to transport the to-be-processed body between the two process chambers.

When both the application means and the heating means are provided in a single process chamber, a transfer means is provided for transferring the to-be-processed body from a first area, where application is performed by the application means, to a second area, where heating is performed by the heating means.

These and other objects, features and advantages of the present invention will become more apparent from the following detailed description to those skilled in the art, when taken in conjunction with the accompanying drawings.

BEST MODE FOR CARRYING OUT THE INVENTION

Figure 1:
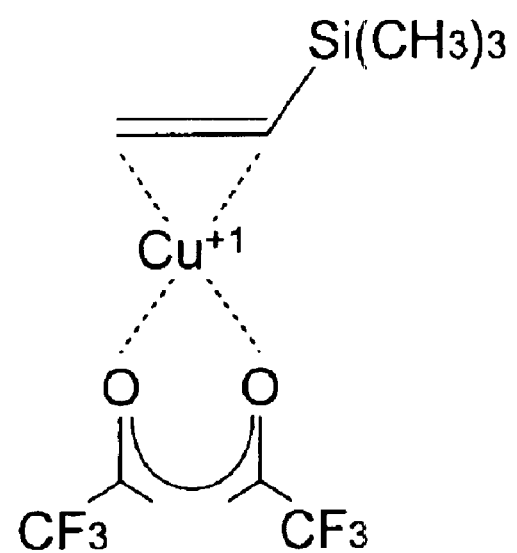
FIG. 1 illustrates the constitutional formula of (hfac)$Cu^{+1}$(tmvs)

In the following, the preferred embodiments according to the present invention will be described in detail while referencing the Figures. It is noted here that throughout all of the drawings, the same or corresponding parts are labeled with the same respective reference numerals and repetitive descriptions are omitted. Furthermore, in the following embodiments, the case of using (hfac)Cu$^{+1}$(tmvs), which is an organic metal, as the film base material, and forming a thin film of copper on the surface of the semiconductor wafer is assumed. The constitutional formula of (hfac)Cu$^+$₁(tmvs) is shown in FIG. 1, and it is in its fluid state in an environment of normal pressure at room temperature. In addition, the viscosity of (hfac)Cu$^{+1}$(tmvs) is low, and although it can be applicable for use as it is in the present invention to be described below, in the following embodiments, it is mixed with an organic solvent such as heptadecane to allow for easier handling. In the following, the organometallic fluid containing this (hfac)Cu$^{+1}$(tmvs) is referred to as 'film deposition fluid'.

Figure 2:
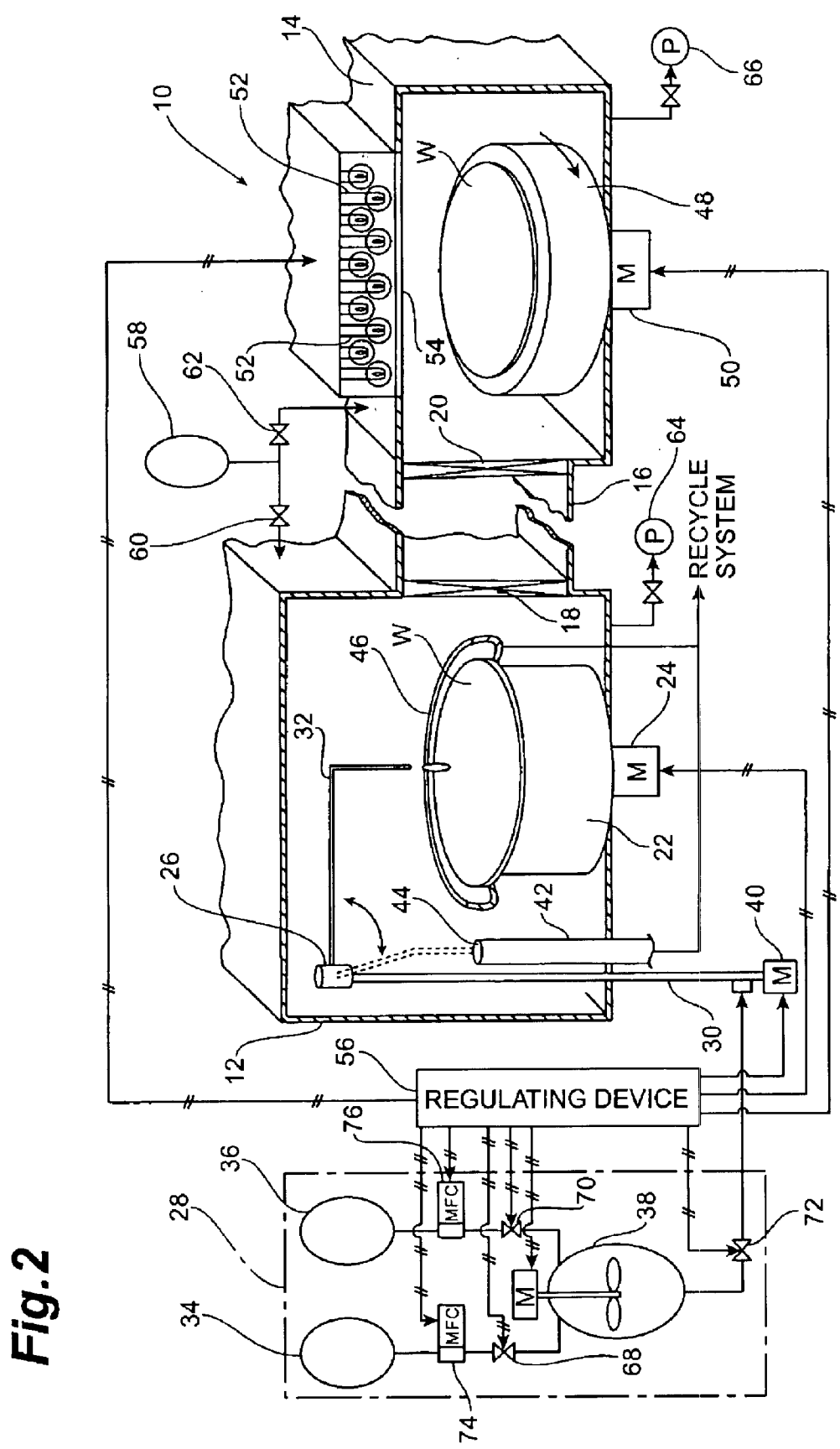
FIG. 2 is an explanatory diagram that schematically illustrates the first embodiment of a film deposition apparatus according to the present invention.

FIG. 2 illustrates the first embodiment of the film deposition apparatus according to the present invention. Film deposition apparatus 10 shown in the figure comprises first process chamber 12, in which is performed processing that applies film deposition fluid to the object to be processed, that is, the semiconductor wafer W; and second process chamber 14, in which is performed processing that pyrolytically decomposes the organic metal, or in other words, the (hfac)Cu$^{+1}$(tmvs) on wafer W.

First process chamber 12 and second process chamber 14 are connected through transfer chamber 16, which is located between them, and wafer W can be transferred between process chambers 12 and 14 using an appropriate carrying means (not shown in the Figure) In the Figure, reference numerals 18 and 20 refer to the slit valves that open and close the sections between transfer chamber 16 and process chambers 12 and 14, respectively.

Turntable 22 is configured inside first process chamber 12 to hold semiconductor wafer W. Wafer W is mounted horizontally on the upper surface of this turntable 22, and is held in place with an appropriate holding means such as a vacuum chuck, not shown in the Figures. Turntable 22 shown in the Figure has a diameter that is smaller than the diameter of wafer W, because if the diameter of turntable 22 were larger than wafer W, not only would film deposition fluid adhere to wafer W, but also to the exposed portions of turntable 22, which can have negative repercussions for the next wafer W to be processed. In addition, turntable 22 is structured to allow it to be turned at relatively high speeds by a drive motor 24, which is configured external to first process chamber 12.

In first process chamber 12, application device (application means) 26 is further provided for applying film deposition fluid to the surface of wafer W. Application device 26 comprises supply pipeline 30, which introduces film deposition fluid from film deposition fluid supply system (supply means) 28 configured external to first process chamber 12; and nozzle 32, which extends horizontally from the upper terminal of this supply pipeline 30 and has its end facing downward. The main components of supply system 28 are (hfac)Cu$^{+1}$(tmvs) source 34; heptadecane source 36; and mixing device 38, which mixes the fluids from sources 34 and 36 to form the film deposition fluid. Supply pipeline 30 is configured so that it may be rotationally driven both backwards and forwards by actuator 40, which may be, for example, a drive motor, and because of this nozzle 32 is able to swing about the center axis of supply pipeline 30. Since the distance from the axis of supply pipeline 30 to the end of nozzle 32 is approximately the same as the distance from the axis of supply pipeline 30 to the rotational center of turntable 22, the tip of nozzle 32 is able to pass above the exact center of wafer W supported on turntable 22.

Drainpipe 42 is configured adjacent to turntable 22. The upper end of the fluid receptor of this drainpipe 42 is positioned so that when nozzle 32 is at its starting position after evacuating from turntable 22, it is directly under the end of nozzle 32. Because of this, any film deposition fluid that drips from nozzle 32 can be collected through the collection system (not shown in the Figures) in its pre-reaction state. There is also a ring-shaped, gutter-like member 46 configured around the rim of turntable 22. This gutter-like member 46 is used to collect film deposition fluid that splashes off wafer W. It is preferable to collect and reuse (hfac)Cu$^{+1}$(tmvs) since it is a high cost material. Besides this type of collection means, which utilizes drain pipe 42 and gutter-like member 46, any number of variations of collection means such as forming a collection duct in the bottom surface of process chamber 12 may also be considered. It is possible to then regenerate (hfac)Cu$^{+1}$(tmvs) from the collected film deposition fluid. In such situations, the organic metal may be utilized more economically, which contributes to an overall reduction in base material costs. Moreover, after collecting the film deposition fluid, it is also possible to perform filter ring processing and reusing the film deposition fluid.

Likewise, turntable 48 is configured in second process chamber 14 to hold wafer W in a manner such that it can be rotated. This turntable 48 has basically the same mechanism as turntable 22 in first process chamber 12, whereby it is rotated by drive motor 50 and can hold wafer W in place using an applicable means such as a vacuum chuck. However, turntable 48 rotates at a slower speed than turntable 22 in first process chamber 12. In addition, the diameter of turntable 48 is made larger than the diameter of wafer W. This difference is necessary for causing a pyrolytic decomposition reaction of the organic metal to uniformly occur on the surface of wafer W in second process chamber 12.

Above turntable 48, a plurality of heating lamps 52, which may be for example halogen lamps, are configured placed behind silica glass plate 54. This configuration allows the surface of the wafer W that is locked onto turntable 48 to be heated. Temperature control is achieved based on the signals output from temperature gages (not shown in the Figure) such as a thermoelectric couple attached to turntable 48 or a pyrometer configured on the ceiling of process chamber 14, and is performed by regulating device 56, which comprises for example a microcomputer, that turns on and off, or regulates the amount of power input to heating lamps 52.

It is noted here that in FIG. 2, reference marker 58 refers to supply source 58 of a certain inert gas such as nitrogen gas, and is configured to supply a certain inert gas to first process chamber 12 and second process chamber 14, respectively. On each of the pipelines from inert gas supply source 58 there are configured respective flow regulating valves 60 and 62. In addition, reference numbers 64 and 66 refer to exhaust pumps, which are used to evacuate the atmosphere inside process chambers 12 and 14, respectively. These exhaust pumps 64 and 66, together with flow regulating valves 60 and 62, are regulated by regulating device 56 described above. Regulating device 56, in this first embodiment, further regulates drive motors 24 and 50 of turntables 22 and 48; swinging actuator 40 of nozzle 32; open/close valves 68, 70, and 72 and mixing device 38 in film deposition fluid supply system 28; and mass flow rate regulating devices 74 and 76.

Next, the procedure will be described for performing copper film deposition using film deposition apparatus 10 with the structure described above. It is noted here that, while not specifically stated, the following procedure is automatically performed under the management by regulating device 56.

To begin with, wafer W is sent into first process chamber 12 and wafer W is placed at a predetermined position on the upper surface of turntable 22 and locked in. At this point, in order to prevent oxidization of the surface of wafer W or other reactions from happening, it is preferable that an inert gas such as nitrogen gas be supplied from inert gas supply source 58 while driving exhaust pump 64, to form an inert gas atmosphere inside of first process chamber 12.

Next, drive motor 24 is activated causing turntable 22 to rotate at a predetermined rotational speed and at the same time the end of nozzle 32 is positioned directly above the center of wafer W, film deposition fluid is poured onto the surface of wafer W from film deposition fluid supply system 28 through supply pipeline 30 and nozzle 32. Since turntable 22 is rotating at a relatively high speed, the film deposition fluid poured onto wafer W spreads out towards its rim due to centrifugal force so that the surface of wafer W may be coated with film deposition fluid. The rotational speed of turntable 22 is set depending on variables such as the viscosity of the film deposition fluid and the amount supplied. Actuator 40 is then activated and at the same time begins to swing nozzle 32 at an appropriate frequency and speed to apply film deposition fluid across the entire surface of wafer W with uniform thickness and quality.

When the pressure inside first process chamber 12 is set higher than normal air pressure, coverage is improved by the effects of air pressure forcing it in. In cases where filling-in processing is being performed, openings such as contact holes and trenches formed in the surface of wafer W can be surely filled in so that the development of problems such as vacancies can be avoided. Moreover, the temperature inside first process chamber 12 should be the temperature of the organic metal (hfac)Cu$^{+1}$(tmvs) in its non-reactive range, and preferably normal room temperature.

A quantity of the film deposition fluid supplied to wafer W splatter off from the edge of wafer W due to the centrifugal force. As a result, the film deposition fluid is not able to travel around onto the exposed portion of the underside of wafer W to prevent film from being deposited on the undersurface of the wafer. The formation of film on the underside of wafer W can have the undesired effect of causing it to be particlized. In addition, since the gutter-like member 46 is provided in the first embodiment, the film deposition fluid that has been splattered can be collected into the appropriate collection system via gutter-like member 46 allowing it to be reused.

Once the application procedure has ended, the supply of film deposition fluid is terminated, and while the end of nozzle 32 is returned to its original position directly over drainpipe 32, the rotation of turntable 22 is stopped. There is a possibility that film deposition fluid may drip from the end of nozzle 32; however, such a film deposition fluid will be received and collected by fluid receptor 44 of drainpipe 42.

Next, slit valves 18 and 20 are temporarily opened up and using a carrying means (not shown in the Figure) wafer W is moved from first process chamber 12 to second process chamber 14 through transfer chamber 16, placed on turntable 48 in a predetermined position, and locked into place. The air inside second process chamber 14 has already been made into an inert gas atmosphere during the application procedure described above, and the pressure inside is set higher than normal air pressure. It is noted here that by also making an inert gas atmosphere inside transfer chamber 16, it is possible to perform an entire processing series without exposing wafer W to the outside air, thereby preventing harmful influences such as natural oxidation.

Figure 3:
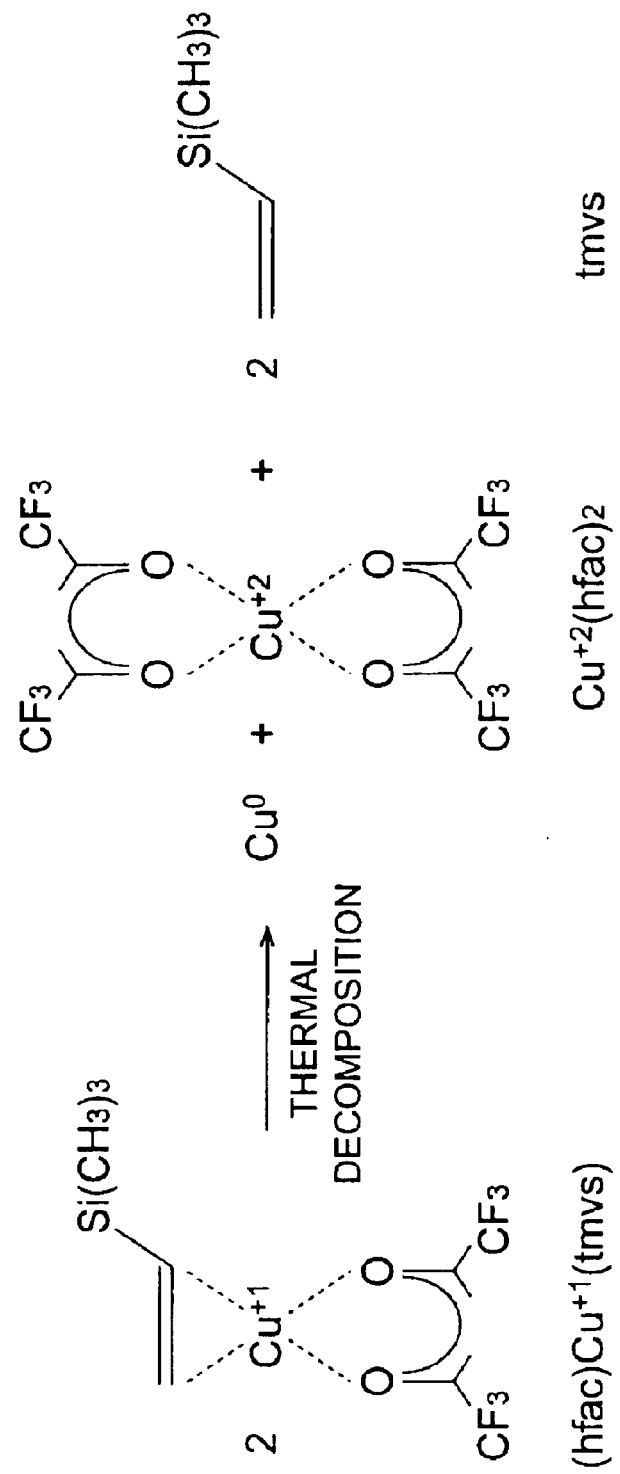
FIG. 3 illustrates the reaction equation of the pyrolytic decomposition reaction of (hfac)$Cu^{+1}$(tmvs)

Once wafer W has been placed in the predetermined position, drive motor 50 is activated causing turntable 48 to rotate while also activating heating lamps 52 and regulating them to increase the temperature of surface of wafer W to a predetermined temperature, for example between 150° C. and 200° C. This causes a pyrolytic decomposition reaction of the (hfac)Cu$^{+1}$(tmvs) contained in the film deposition fluid coating the surface of wafer W, which yields the precipitation of a copper film on the surface of wafer W. The pyrolytic decomposition reaction of (hfac)Cu$^{+1}$(tmvs) is as shown in FIG. 3.

During this reaction, the Cu$^{+2}$(hfac)$_2$ and tmvs that are formed are released out of second process chamber 14 by exhaust pump 66 because they change into their respective gas state because of the temperature inside second process chamber 14 during the pyrolytic decomposition reaction. Also due to the temperature, the organic solvent heptadecane is evaporated off of wafer W and released without leaving a trace.

As described above, the uniform thickness and quality of the layer of film deposition fluid throughout the entire surface of wafer W allows the copper film being formed to have uniform film thickness and quality as well. In addition, the fact that turntable 48 is rotated allows the unequal distribution of temperature resulting from the positioning of heating lamps 52 to be prevented, and in addition, allows the heat dissipation throughout wafer W to become fairly uniform as a result of the entire undersurface of wafer W being in contact with turntable 48. Accordingly, the pyrolytic decomposition reaction can occur uniformly throughout the entire wafer surface, further contributing to improved uniformity of layer thickness and quality. Moreover, in this embodiment, the pressure inside second process chamber 14 is higher than normal air pressure, which also increases the boiling point of the film deposition fluid. As a result, natural evaporation from the surface of the film deposition fluid during the pyrolytic decomposition reaction is inhibited, thus yielding a stable pyrolytic decomposition reaction. Once the pyrolytic decomposition reaction procedure has ended, wafer W is transported out of second process chamber 14 and the film deposition process is completed.

In this manner, by separating the application procedure and the pyrolytic decomposition reaction procedure, a superb copper thin film may be obtained having uniform film thickness and quality throughout its surface in the manner described above; however, in addition to this, since the application process can be performed at temperatures within the non-reactive range, residual film deposition fluid may be collected and reused making it economically advantageous. Furthermore, since the film deposition fluid flows in its fluid form, no actual problems related to blockage forming in the supply system develops. In addition, the extremely high speed of film deposition, compared to the MOCVD process, is particularly effective in cases where thicker films are used such as during the process of filling holes or trenches.

The first embodiment is described in detail above; however, various alternative modifications may be performed without deviating from the scope of present invention.

Figure 4:
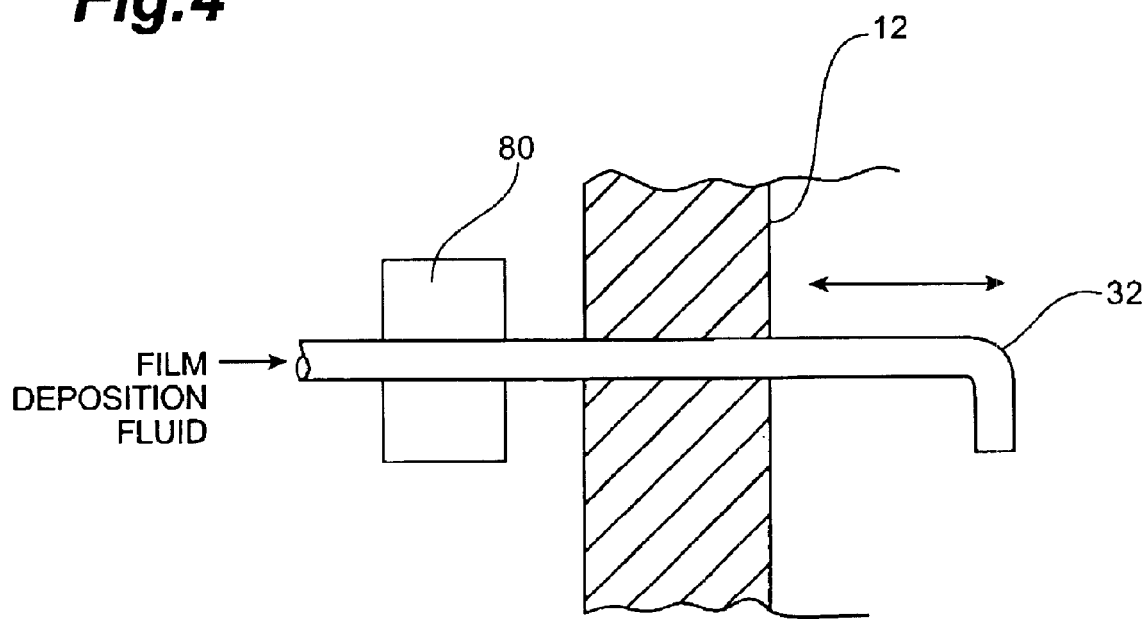
FIG. 4 is a partial cross-sectional view showing an outline of an alternative application device for the film deposition apparatus in FIG. 2.
Figure 5:
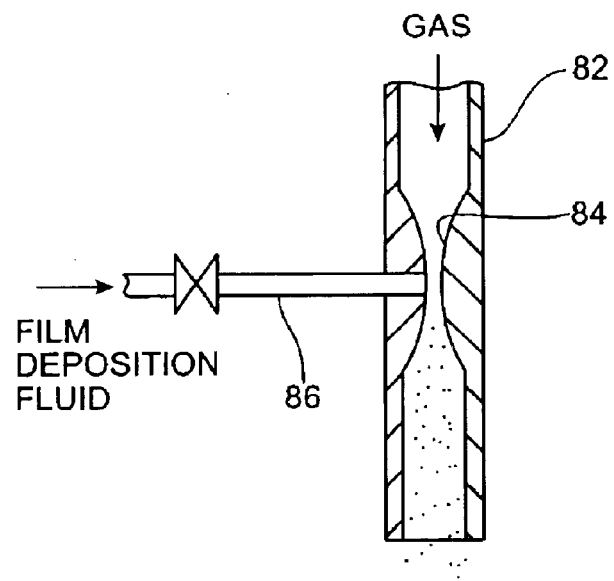
FIG. 5 is a partial cross-sectional view showing an outline of a different alternative application device for the film deposition apparatus in FIG. 2.

For example, in the above embodiment, nozzle 32 has a structure allowing it to swing; however, as shown in FIG. 4, it may also be moved back and force in a straight line using direct movement mechanism 80.

Furthermore, the film deposition fluid sputtered from nozzle 32 may be atomized (sprayed). In this case, a number of variations can be considered, such as providing a means of atomization whereby nozzle 32 itself is a misting nozzle that injects and splatters a film deposition fluid from tiny holes; providing a means of misting whereby a throttle 84 is formed inside inert gas injection tube 82 and the negative pressure formed at this throttle 84 is used to suck out the film deposition fluid inside supply pipeline 86; or providing a means whereby film deposition fluid is atomized using ultrasonic waves. In cases where film deposition fluid is atomized onto the surface of wafer W, the surface of the wafer can be effectively moistened so that it becomes possible to reduce the amount of film deposition fluid supplied. Even in cases where wafer W is placed on a fixed susceptor without using turntable 22, it is possible to apply film deposition fluid with uniform film thickness and quality by appropriately scanning wafer W with the end of nozzle 32 or inert gas injection pipe 82. It is noted here that it also becomes possible to perform localized application by injecting film deposition fluid without turning wafer W. Namely, the film thickness in certain localized portions of the surface of wafer W may be changed, or the deposition of film in areas such as the beveled portion around the rim of wafer W may even be avoided all together.

Here, another means of preventing film deposition fluid from being applied to the beveled portion of wafer W will be described. In this beveled portion, the film is unstable, may easily flake off, and increases the probability that it may be particlized, which is why it is preferable to not perform film deposition in the beveled portion of wafer W. Furthermore, when chemical metal polishing (CMP) is performed, it can cause residual dregs to develop and in addition, when a point in the beveled portion is made the CMP process endpoint, if a film has been formed, the endpoint can no longer be the same, becoming another reason why film thickness may differ among devices. Since there is no film of any other material formed at the peak (rim) of the beveled portion, if a copper film is formed there then the copper will spread into the base (Si) of the silicon wafer W increasing the possibility that the characteristics of the manufactured semiconductor device will be unstable.

Figure 6:
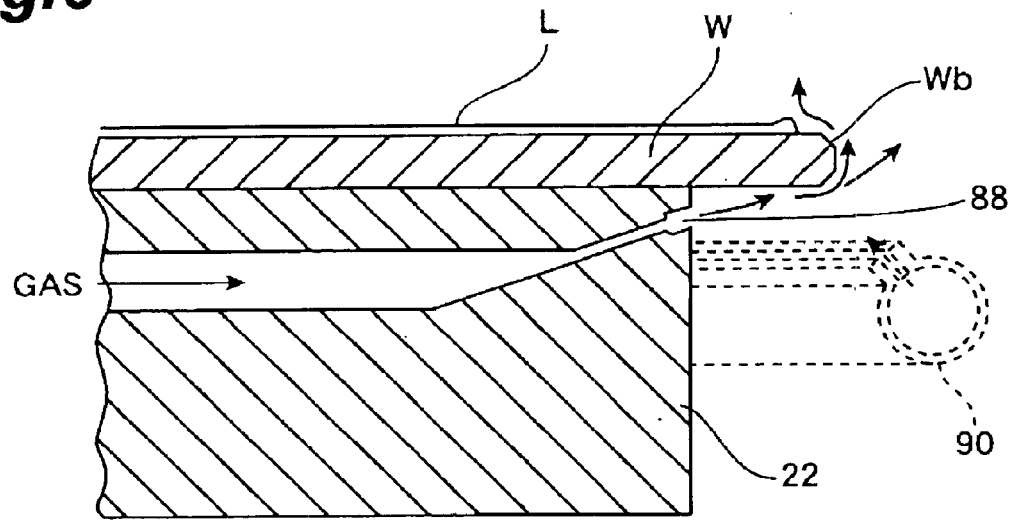
FIG. 6 is a partial cross-sectional view showing an outline of a means of stopping the adhesion of film deposition fluid to the beveled portion of the wafer.
Figure 7:
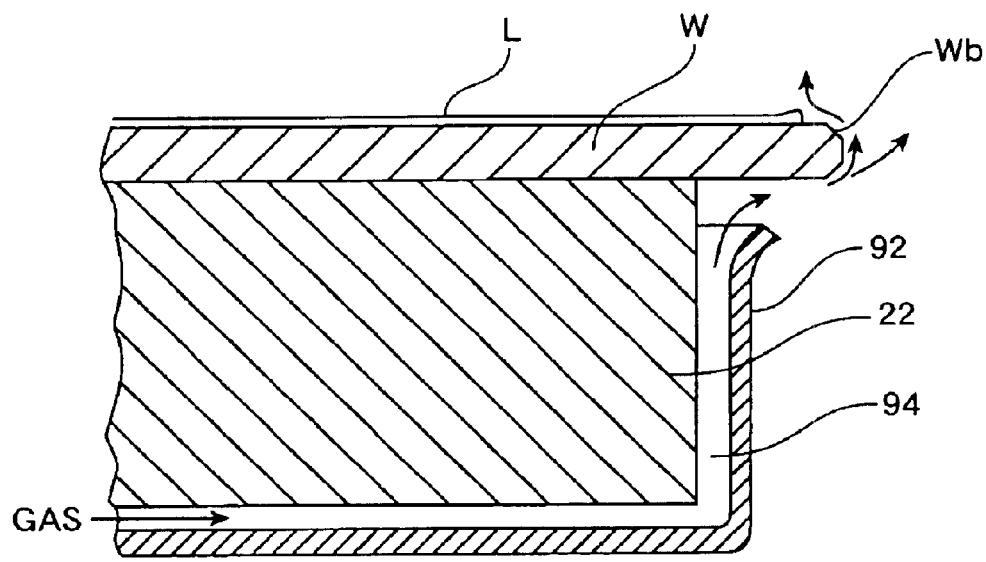
FIG. 7 is a partial cross-sectional view showing an outline of a different means of stopping the adhesion of film deposition fluid to the beveled portion of the wafer.

FIG. 6 shows a means of preventing film deposition fluid from adhering to beveled portion Wb of wafer W. This means is structure that is built into the film deposition apparatus 10 that was described above in FIG. 2, and has the structure whereby a ring-shaped injection trough or a plurality of injection holes 88, which inject inert gas uniformly towards the outer circumference of wafer W, are formed on the surface of the circumference of turntable 22 in first process chamber 12. With this type of structure, when inert gas is injected from the ring-shaped injection trough or injection holes 88, the inert gas is blown towards the outer rim of the underside of wafer W, and a part of it travels around beveled portion Wb reaching the outer rim of the surface of wafer W. As a result, film deposition fluid L on the surface of wafer W does not reach the beveled portion Wb, and even if it does reach it, it is removed due to the force of the wind. Of course, the provision of a separate ring-shaped nozzle (the component drawn with the dotted line in FIG. 6) exclusively for blowing inert gas around wafer W can be considered as a means of blowing inert gas to prevent film deposition fluid from adhering to the beveled portion Wb. In addition, covering member 92 may be configured, as shown FIG. 7, so as to cover the lower part of turntable 22, and inert gas blown into beveled portion Wb of wafer W through the gas channel which is the gap 94 formed between cover component 92 and turntable 22, in the same manner as FIG. 6.

From the viewpoint of preventing film from being deposited on beveled portion Wb, it is also acceptable to spray a gas that inhibits a pyrolytic decomposition reaction from occurring on beveled portion Wb in second process chamber 14. The same structure as that shown in FIG. 6 and FIG. 7 may be considered as a means of spraying such gas. The inventors discovered that when tmvs is sprayed onto the film deposition fluid during pyrolytic decomposition, the pyrolytic decomposition reaction at that spot is inhibited; however, when tmvs is supplied as a reaction suppressing gas, since a high density of reaction suppressing gas exists along the rim of the underside of wafer W, beveled portion Wb, and the rim of the front side, deposition may be prevented in those regions.

Also, variety of forms may be considered for application device 26, which is provided in first process chamber 12, and is not limited to the nozzle (spin coating) or atomized (spray) formats mentioned above. For example, application device 126 outlined in FIG. 8 employs a roller format. Specifically, this application device 126 comprises a sponge roller pad 100 positioned above turntable 22. Roller pad 100 is supported by supporting member 102 at both ends in a manner such that it is allowed to roll with its rotational axis horizontal. This supporting member 102 is able to move up and down driven by driving device 104, which is configured on the ceiling of process chamber 12, in a manner that facilitates attachment and separation to and from wafer W, which is supported by turntable 22. Supporting member 102 may also be moved back and forth horizontally.

Sputtering pipe 106, which delivers film deposition fluid in order to wet roller pad 100, is also attached to supporting member 102. The end of this sputtering pipe 106 is situated above roller pad 100, and horizontal portion 107, along which are configured a plurality of sputtering outlets, is horizontally extended along roller pad 100, running along almost its entire length. Consequently, when film deposition fluid is poured through the delivery outlets of sputtering pipes 106 and 107 from the supply system, roller pad 100 becomes fairly evenly wet with film deposition fluid.

With this type of structure, when film deposition fluid is applied to wafer W, as film deposition fluid is being sputtered continuously or intermittently, drive device 104 is activated to lower roller pad 100 and bring it into contact with wafer W. It is then rolled back and forth over the surface of wafer W. While this is occurring, turntable 22 begins to rotate at a relatively slow speed and film deposition fluid is applied to the portion that is in contact with roller pad 100. The rotation of turntable 22 and the back and forth movement of roller pad 100 are appropriately adjusted so that film deposition fluid may be applied uniformly to the entire surface of wafer W. In this case, since only those portions that come into contact with roller pad 100 have been applied, there is little film deposition fluid wasted and thus effective at dramatically reducing the amount of fluid spillage.

Figure 8:
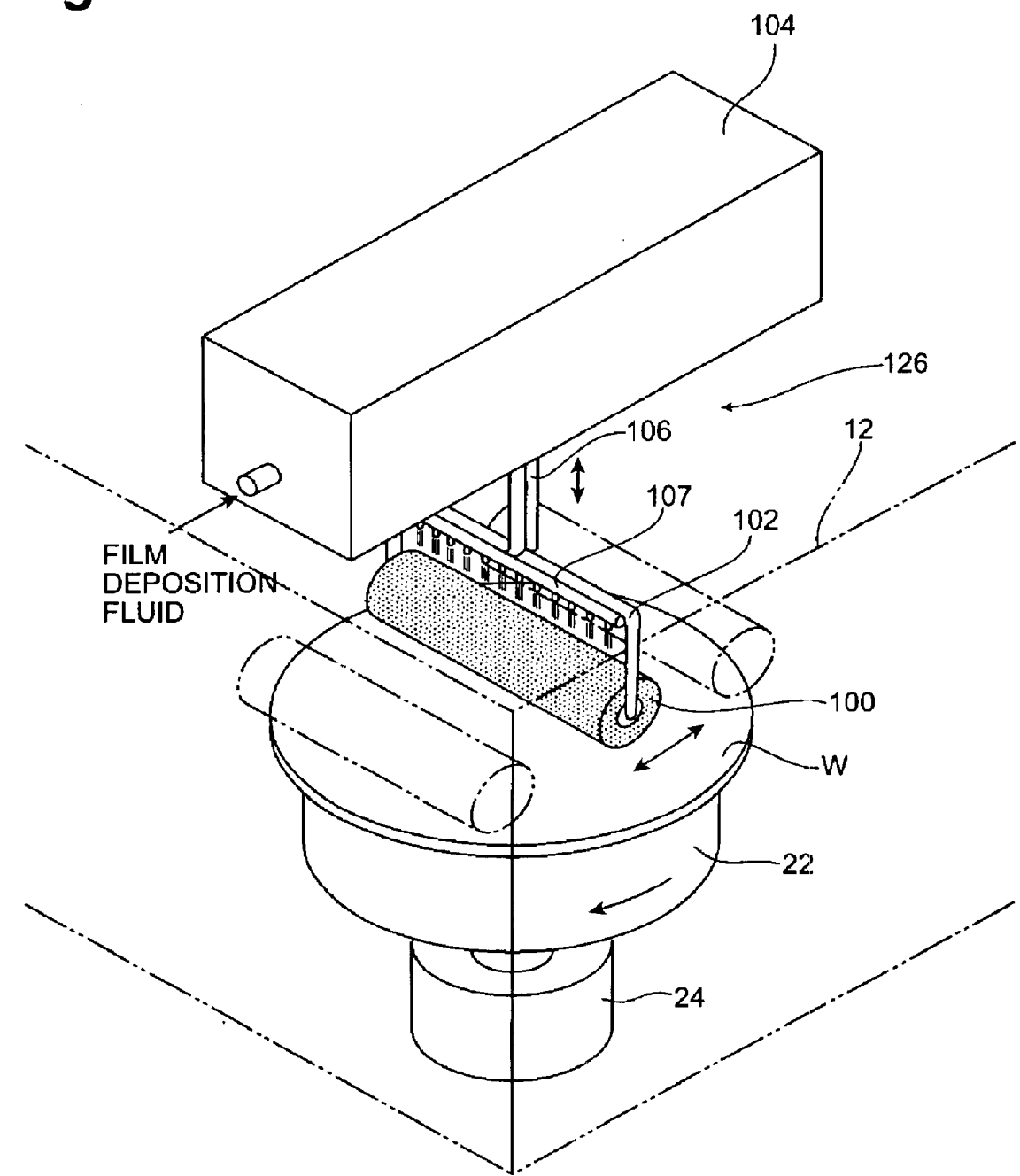
FIG. 8 is a main section oblique perspective view showing an outline of yet another alternative application device for the film deposition device in FIG. 2.
Figure 9:
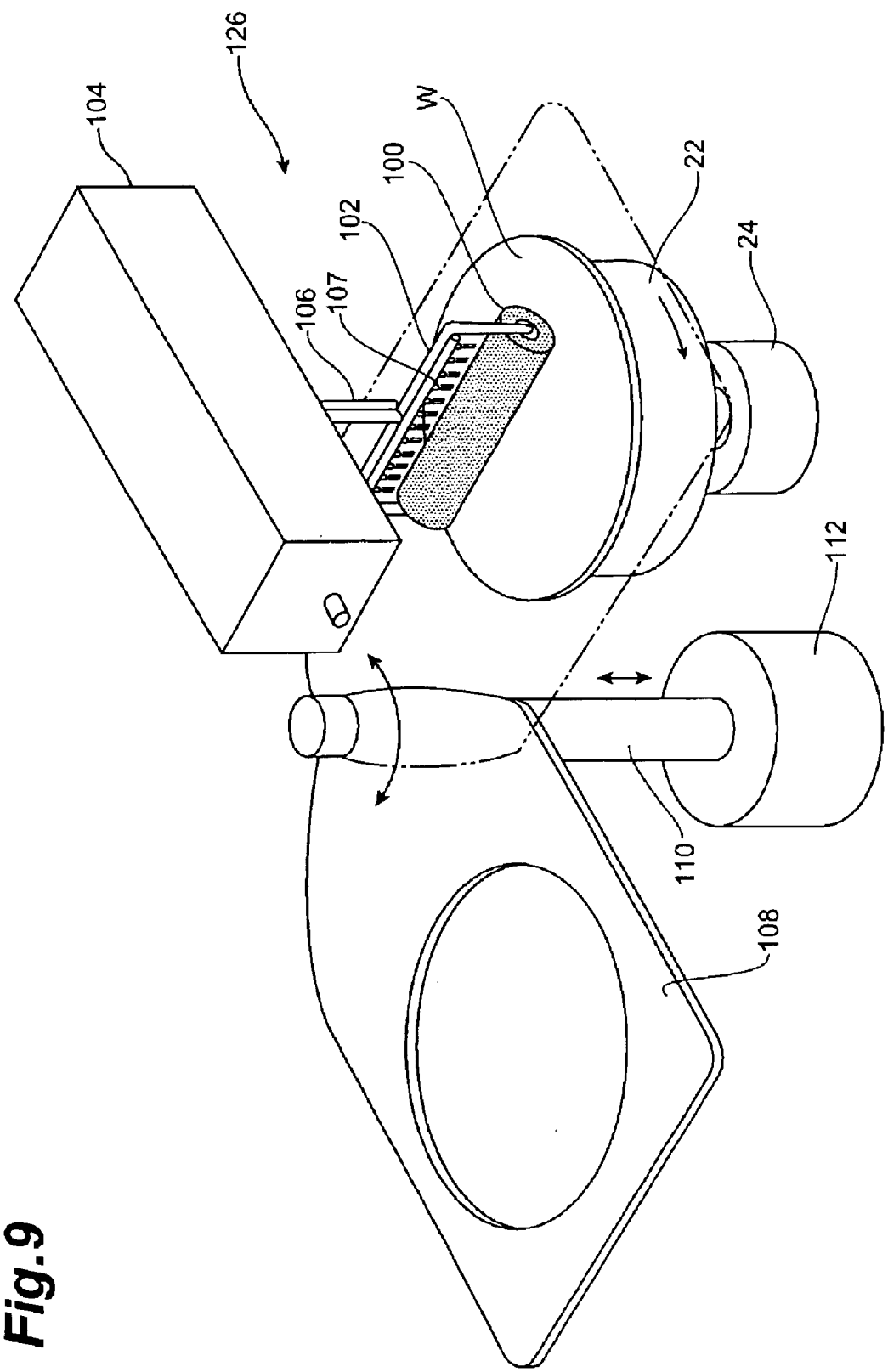
FIG. 9 is a main section oblique perspective view showing an outline of the alternative application device in FIG. 8.

FIG. 9 shows another alternative form of the application device 126 that is shown in FIG. 8. Application device 126 in FIG. 9 is different from that shown in FIG. 8 in that it further comprises mask 108 to prevent application to the no-application areas, namely the outer extremities (beveled portion) of wafer W. This mask 106 is supported within first chamber 12 using support shaft 110. Support shaft 110 is configured such that it is able to rotate and also move up and down. Consequently, by activating drive device 112 of support shaft 110, mask 108 can be swung into place over wafer W on turntable 22, then lowered to adjoin the outer extremities of wafer W making it possible to perform masking of those portions. Roller pad 100 is thus not able to come into contact with the portions that are covered by this mask 108; therefore preventing application to those portions. It is understood that the mechanism for moving mask 108 is not limited to the configuration shown in the Figure.

In this manner of application device 126, the same results are obtained if, instead of roller pad 100, a supple brush is used. Alternatively it is possible to use as a roller application device a chemical metal polishing (CMP) device (not shown in the Figures), which is a device that wets the pad of its platen with a polishing slurry, brings it into contact with the surface of the wafer, and moves them relative to each other, if instead of slurry film deposition fluid is supplied for the pad of its platen. In current semiconductor manufacturing facilities, where multi-stage processing with a plurality of CMP devices is widely used, one of the stages may be effectively used as an application device.

Figure 10:
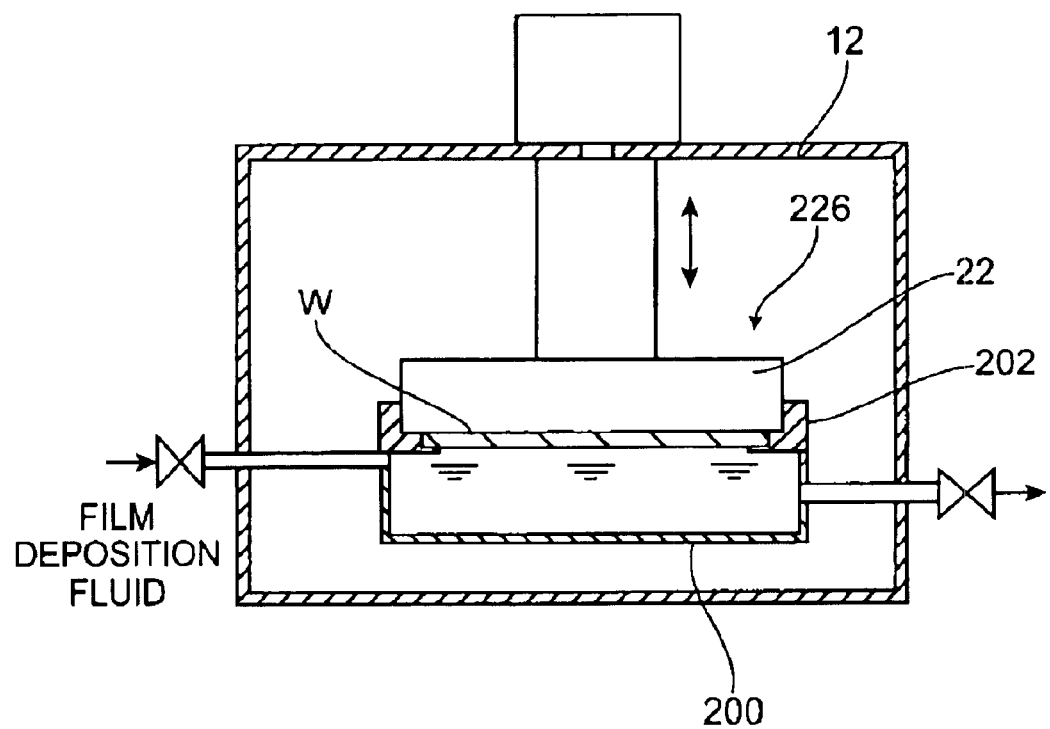
FIG. 10 is a cross-sectional view showing an outline of another alternative application device for the film deposition device in FIG. 2.

As shown in FIG. 10, an immersion-type device may also be used as another, alternative application device. Application device 226 in FIG. 10 is comprised of fluid tank 200, which holds the film deposition fluid that is supplied from the supply system 28. Wafer W is lowered into fluid tank 200 from above, which means that turntable 22, unlike in the above embodiment, is configured facing down in order to soak the surface of wafer W in the film deposition fluid of fluid tank 200, and hangs down from the ceiling of process chamber 12 in a manner such that it is able to move up and down. Ring-shaped clamp 202 is provided on this turntable 22 so that the rim of wafer W may be sandwiched in between clamp 202 and the holding surface of turntable 22. If the adhesiveness of clamp 202 and turntable 22 to wafer W is high enough, then the film deposition fluid is not able to seep into the portion that is in contact so that the application of film deposition fluid to the beveled portion and the undersurface of wafer W may be prevented. It is noted here that wafer W may be immersed in the film deposition fluid by simply being lowered; however, since the application or adhesion may not be very effective, it is preferable that turntable 22 be rotated. In addition, it is possible to improve the uniformity of application and filling-in characteristics in cases where a wafer support means that does not rotate is used instead of turntable 22, by causing the wafer support means to vibrate and/or the film deposition fluid to vibrate.

The application characteristics of the film deposition fluid to wafer W, such as adhesion or penetration, largely depend on the viscosity of the film deposition fluid and the base material of the under layer; however, in cases where this immersion-type application device 226 is used, it is possible to effectively apply film deposition fluid to the top of wafer W without regard to the dependent factors such as viscosity. Furthermore, after wafer W is pulled back up, since surplus film deposition fluid returns to fluid tank 200, the amount of film deposition fluid used may be reduced.

The heating means used for causing a pyrolytic decomposition reaction to occur in second chamber 14 is not limited to heating lamps 52. For example, a resistance heater, an induction-heating device, or an oil heater may be integrated into the turntable that acts as a wafer support means or into the susceptor.

Figure 11:
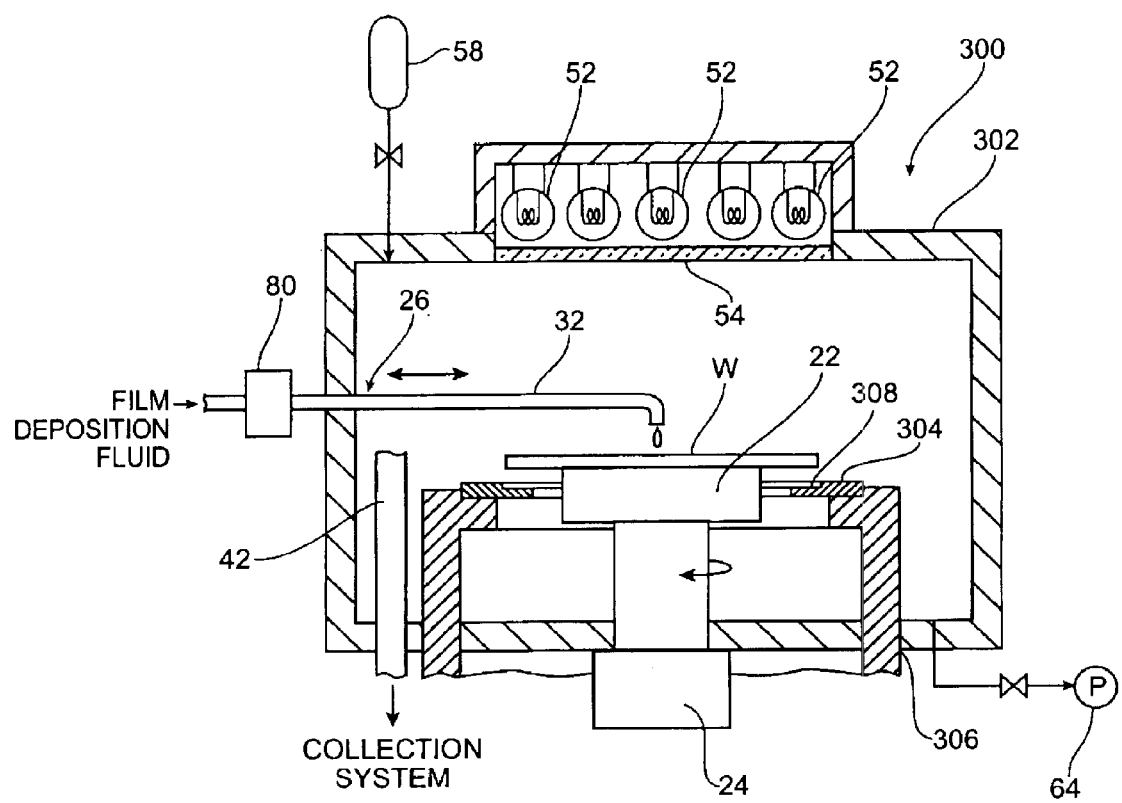
FIG. 11 is a cross-sectional view of an outline of the second embodiment of the film deposition apparatus according to the present invention and a diagram illustrating the state of the application procedure.
Figure 12:
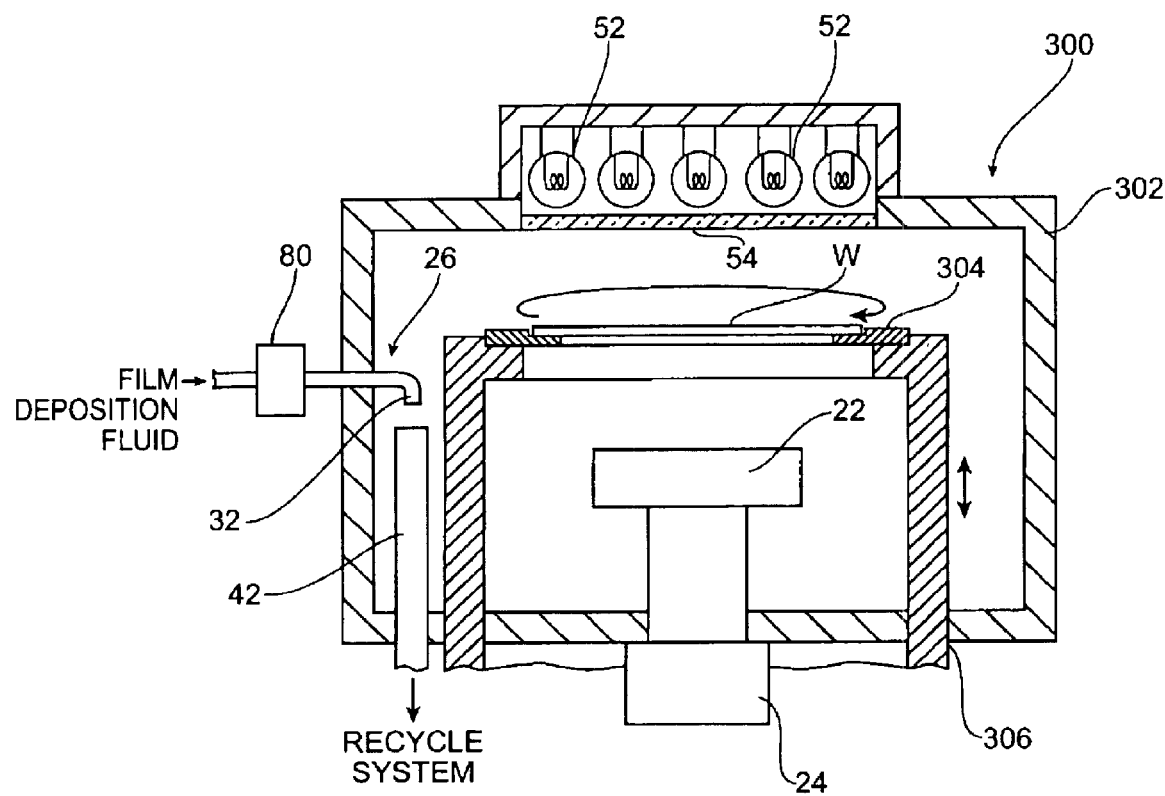
FIG. 12 is a cross-sectional view showing the state of the pyrolytic decomposition procedure for the film deposition apparatus shown in FIG. 11.

In the first embodiment and the alternatives described above, the application procedure is performed in one of the two process chambers 12 and 14, and the pyrolytic decomposition reaction procedure is performed in the other. Nonetheless, it is also possible to perform both of these procedures sequentially in just one chamber. FIGS. 11 and 12 are schematic diagrams of the second embodiment of a film deposition apparatus 300 according to the present invention, in which there is only one process chamber.

In FIGS. 11 and 12, reference numeral 302 denotes the process chamber, and on its ceiling there are configured a plurality of, for example, halogen heating lamps 52. Inside process chamber 302, there are configured turntable 22, which is similar to the turntable in the first embodiment, and nozzle 32, which is similar to the direct movement-type nozzle that injects film deposition fluid as shown in FIG. 4. Along the periphery of turntable 22, ring-shaped wafer support 304 is configured having the same axis as turntable 22. This wafer support 304 is moved up and down by means of lift mechanism 306. On wafer support 304, there is formed concave region 308, which has a diameter that is slightly larger than the diameter of wafer W, and into this concave region 308, wafer W is fitted so as to be held in place. Lift mechanism 306 is configured in a manner such that it may be rotated by a drive motor (not shown in the Figures). Since lift mechanism 306 and wafer support 304 are formed as a single mass, if lift mechanism 306 is rotated, then wafer support 304 is also rotated. The other structural components are similar to those shown in FIG. 2; as such, they are assigned the same reference numerals and their descriptions are omitted here.

With this type of configuration, to begin with, wafer W, which has been carried into process chamber 302 in the same manner as with the first embodiment, is placed on turntable 22 and locked. Next, as turntable 22 is being rotated, nozzle 32 and the film deposition fluid supply system are activated to apply film deposition fluid to the surface of wafer W. At this point, wafer support 304 is positioned by lift mechanism 306 to be lower than the upper surface of turntable 22 (see FIG. 11).

Once the application of film deposition is completed, wafer W is released from being locked onto turntable 22 and wafer support 304 is raised up by lift mechanism 306. As a result, as shown in FIG. 12, wafer W is transferred onto the concave portion of wafer support 304, separated from turntable 22, and positioned at a location directly below heating lamps 52. Heating lamps 52 are then illuminated and wafer W is heated to cause the pyrolytic decomposition reaction to occur throughout the film deposition fluid, thus effectively forming a copper film on wafer W. While this is occurring, lift mechanism 306 and wafer support 304, and accordingly wafer W on top of wafer support 304, are all rotated to even out the temperature distribution of wafer W, which contributes to the uniformity of the film thickness and quality of the surface.

With the embodiment shown in FIGS. 11 and 12, wafer W is transferred from the application area to the heating area by means of lift mechanism 306 and wafer support 304 (transfer means); however, if there is a sufficient amount of heat radiating from heating lamps 52, it may also be feasible to also lock in wafer W and not move it from turntable 22 during the pyrolytic decomposition reaction.

Figure 13:
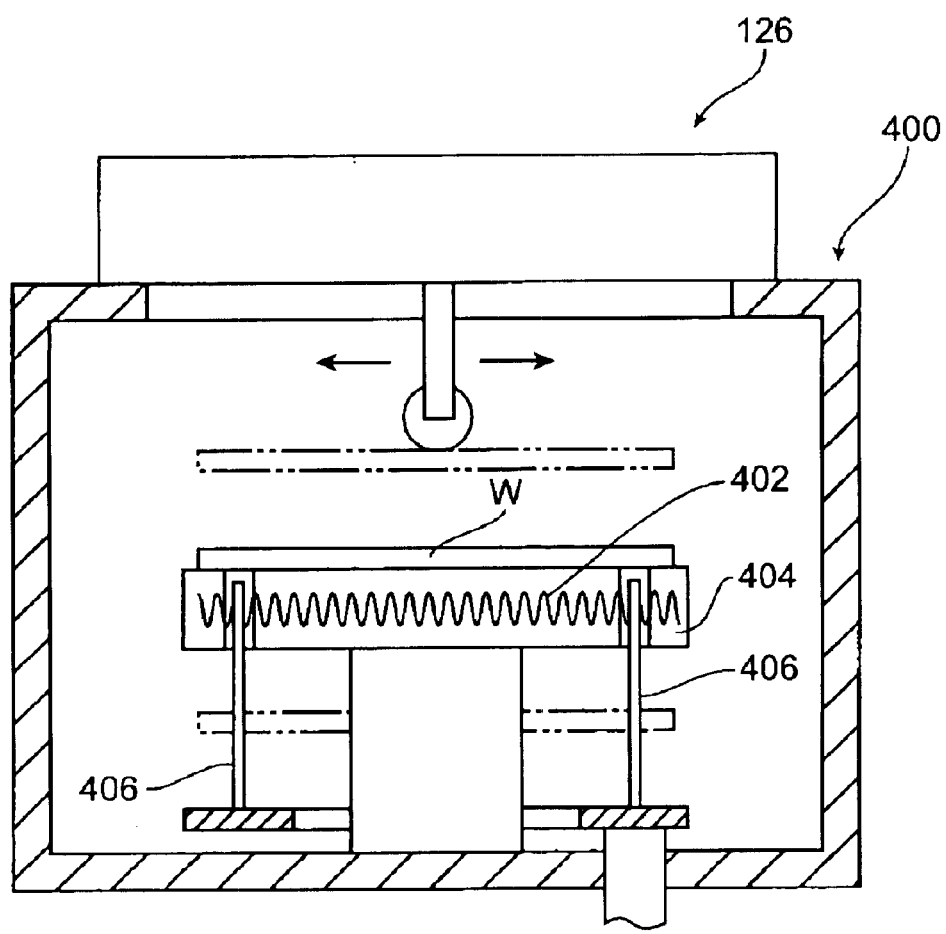
FIG. 13 is a schematic cross-sectional view of an alternative second embodiment of the present invention.

As it is conceptually shown in FIG. 13, film deposition apparatus 400, which is a similar single chamber-type film deposition apparatus capable of performing the two procedures inside a single chamber, has an integrated wafer support means 404 such as a susceptor, which in turn comprises an integrated heating means 402 such as a resistance heater. This wafer support means 404 employs a configuration whereby wafer W may be lifted using lift pin 406, so that when wafer W has been lifted by lift pin 406, application may be performed using, for example, a roller-type application device 126. Then the pyrolytic decomposition reaction may be performed once wafer W is lowered and supported by wafer support means 404.

In the above, the preferred embodiments of the present invention are described in detail; however, it is understood that the present invention is not limited to the various examples mentioned above. For example, in the above examples, film deposition fluid is fluid containing a mixture of a copper diketonate such as (hfac)Cu$^{+1}$(tmvs) and or an aliphatic saturated hydrocarbon such as heptadecane; however, it is also feasible to have the organic metal be another copper diketonate such as (hfac)Cu$^{+1}$(teovs), or any other suitable organic metal. In addition, as the organic solvent for the copper diketonate, another aliphatic saturated hydrocarbon such as pentadecane, hexadecane, or octadecane may be used, and for organic metals besides copper diketonate, any other appropriate solvent may be used. Furthermore, as described above, the film deposition fluid may include only the organic metal.

Industrial Applicability

As described above, according to the present invention, the application procedure of applying organometallic fluid (film deposition fluid) to a wafer, and the pyrolytic decomposition procedure of causing a pyrolytic decomposition reaction of the organic metal in the applied film deposition fluid are performed separately so that film deposition fluid may be applied having uniform film thickness and quality within the wafer. Also, by adding heat in a later step, a thin film having superior film thickness and quality throughout its entirety may be formed.

When the present invention is put to use in semiconductor device manufacturing, since thin films having superior film thickness and quality within the wafer may be effectively formed, it is possible to produce a high quality semiconductor device.

Furthermore, with the present invention, film deposition fluid is used in its liquid form; therefore, the efficiency of film deposition is far more superior than CVD processes, and particularly more effective for implantation processes. Still further, it is effective in that problems such as pipelines in the film deposition fluid supply system becoming clogged are virtually eliminated.

What is claimed is:

1. A film deposition method comprising:

a first step of preparing a fluid that has organic metal as a main component which precipitates a film deposition material using pyrolytic decomposition, wherein the fluid comprises an aliphatic saturated hydrocarbon solvent and the organic metal is a copper diketonate;

a second step of applying the fluid onto a to-be-processed body at a temperature within the non-reactive range of the organic metal; and a third step of heating the to-be-processed body to a second temperature, and causing a pyrolytic decomposition reaction of the organic metal throughout the fluid that is applied onto the to-be-processed body to occur to form a copper film on the to-be-processed body.

2. The film deposition method in claim 1, wherein the to-be-processed body is a semiconductor wafer.

3. A film deposition method comprising:

a first step of preparing a fluid that has organic metal as a main component which precipitates a film deposition material using pyrolytic decomposition, wherein the organic metal is selected from the group consisting of (hfac)Cu(tmvs) and (hfac)Cu(teovs) and the fluid further comprises an aliphatic saturated hydrocarbon solvent;

a second step of applying the fluid onto a to-be-processed body at a temperature within the non-reactive range of the organic metal; and a third step of heating the to-be-processed body to a second temperature, and causing a pyrolytic decomposition reaction of the organic metal throughout the fluid that is applied onto the to-be-processed body to occur to form a copper film on the to-be-processed body.

4. The film deposition method in claim 3, wherein the to-be-processed body is a semiconductor wafer.

5. A film deposition method comprising:

a first step of preparing a fluid that has organic metal as a main component which precipitates a film deposition material using pyrolytic decomposition, wherein the fluid further comprises an aliphatic saturated hydrocarbon solvent;

a second step of applying the fluid onto a to-be-processed body at a temperature within the non-reactive range of the organic metal; and a third step of heating the to-be-processed body to a second temperature, and causing a pyrolytic decomposition reaction of the organic metal throughout the fluid that is applied onto the to-be-processed body to occur to form a film on the to-be-processed body.

6. The film deposition method in claim 5, wherein the organic metal is a copper diketonate.

7. The film deposition method in claim 6, wherein the copper diketonate is selected from the group consisting of (hfac)Cu(tmvs) and (hfac)Cu(teovs).

8. The film deposition method in claim 7, wherein copper is deposited as a film.

9. The film deposition method in claim 8, wherein the to-be-processed body is a semiconductor wafer.

* * * * *